(12) United States Patent
Hwang et al.

(10) Patent No.: US 9,397,757 B2
(45) Date of Patent: Jul. 19, 2016

(54) SEMICONDUCTOR PACKAGES WITH OPTICAL TRANSCEIVERS

(71) Applicant: SK HYNIX INC., Icheon (KR)

(72) Inventors: In Chul Hwang, Icheon (KR); Il Hwan Cho, Icheon (KR); Ki Young Kim, Seongnam (KR); Kyoung Mo Yang, Icheon (KR); Jae Joon Ahn, Icheon (KR); Chong Ho Cho, Incheon (KR)

(73) Assignee: SK HYNIX INC., Icheon (KR)

( * ) Notice: Subject to any disclaimer, the term of this patent is extended or adjusted under 35 U.S.C. 154(b) by 56 days.

(21) Appl. No.: 14/318,529

(22) Filed: Jun. 27, 2014

(65) Prior Publication Data

US 2015/0222364 A1  Aug. 6, 2015

(30) Foreign Application Priority Data

Dec. 31, 2013 (KR) ........................ 10-2013-0168672

(51) Int. Cl.
*H04B 10/80* (2013.01)
*H04B 10/40* (2013.01)
*G02B 6/42* (2006.01)
*H05K 1/18* (2006.01)

(52) U.S. Cl.
CPC ............... *H04B 10/801* (2013.01); *G02B 6/42* (2013.01); *H04B 10/40* (2013.01); *H05K 1/181* (2013.01); *H05K 2201/10121* (2013.01); *H05K 2201/10515* (2013.01)

(58) Field of Classification Search
CPC .......................................... H04B 10/40–10/43
See application file for complete search history.

(56) References Cited

U.S. PATENT DOCUMENTS

| 5,200,631 A  * | 4/1993 | Austin ..................... G02B 6/43 257/433 |
| 5,400,419 A  * | 3/1995 | Heinen ................. H04B 10/40 385/14 |
| 7,079,776 B1 * | 7/2006 | Shimoda ............ H04B 10/1149 257/79 |

FOREIGN PATENT DOCUMENTS

| KR | 10-2010-0002871 A | 1/2010 |
| KR | 10-2011-0016015 A | 2/2011 |

OTHER PUBLICATIONS http://www.thefreedictionary.com/embedded.*

* cited by examiner

*Primary Examiner* — David Payne
*Assistant Examiner* — Casey Kretzer

(57) ABSTRACT

A semiconductor package includes a package substrate, a first semiconductor substrate and a second semiconductor substrate stacked on the package substrate, and an optical transceiver that generates and receives an optical signal travelling between the package substrate and the second semiconductor substrate using an infrared (IR) ray that passes through the first semiconductor substrate.

9 Claims, 6 Drawing Sheets

US 9,397,757 B2

SEMICONDUCTOR PACKAGES WITH OPTICAL TRANSCEIVERS

CROSS-REFERENCE TO RELATED APPLICATION

The present application claims priority under 35 U.S.C 119(a) to Korean Application No. 10-2013-0168672, filed on Dec. 31, 2013, in the Korean Intellectual Property Office, which is incorporated herein by reference in its entirety.

BACKGROUND

1. Technical Field

Embodiments of the present disclosure relate to semiconductor packages and, more particularly, to semiconductor packages with optical transceivers.

2. Related Art

Semiconductor packages which are capable of processing a large amount of data are increasingly in demand with the development of smaller electronic systems such as mobile systems. In response to such a demand, it may be necessary to increase the integration density of semiconductor devices used in the electronic systems. However, there are some limitations in increasing the integration density of the semiconductor devices. Recently, three dimensional semiconductor devices including vertical transistors instead of planar transistors have been proposed to increase the integration density of the semiconductor devices. Nevertheless, there are technical difficulties in developing three dimensional transistors.

Three dimensional semiconductor packages are attractive candidates for high performance semiconductor packages which are capable of processing a large amount of data. For example, stack packages including a plurality of stacked semiconductor devices (also referred to as semiconductor chips) have been proposed to process a large amount of data. High capacity semiconductor packages may be fabricated in a stack package form. That is, each of the high capacity semiconductor packages may be fabricated by stacking a plurality of semiconductor chips. In such a case, the number of signal paths for driving the semiconductor chips may increase in proportion of the number of the stacked semiconductor chips. Further, as the semiconductor chips become scaled down, distances between the electronic signal paths have been reduced, resulting in data distortion that is from skews of interconnections and interference between the signals loaded on the interconnections.

SUMMARY

Various embodiments are directed to semiconductor packages with optical transceivers, memory cards including the same and electronic systems including the same.

According to some embodiments, a semiconductor package includes a package substrate, a first semiconductor substrate and a second semiconductor substrate stacked over a package substrate, and an optical transceiver generating and receiving optical signals travelling between the package substrate and the second semiconductor substrate using infrared rays that pass through the first semiconductor substrate.

According to further embodiments, a semiconductor package includes a package substrate including a first main optical transceiver and a second main optical transceiver, a first semiconductor substrate mounted on the package substrate, the first semiconductor substrate having a first subsidiary optical transceiver aligned with the first main optical transceiver, and a second semiconductor substrate stacked on the first semiconductor substrate, the second semiconductor substrate having a second subsidiary optical transceiver aligned with the second main optical transceiver. The first and second semiconductor substrates are laterally offset to have a step structure such that the second subsidiary optical transceiver receives an optical signal outputted from the second main optical transceiver using an infrared (IR) ray that passes through the first semiconductor substrate.

According to further embodiments, a semiconductor package includes a package substrate including a first main optical transceiver and a second main optical transceiver, a first semiconductor substrate mounted over the package substrate, the first semiconductor substrate having a first subsidiary optical transceiver aligned with the first main optical transceiver, and a second semiconductor substrate stacked on the first semiconductor substrate, the second semiconductor substrate having a second subsidiary optical transceiver aligned with the second main optical transceiver. The second subsidiary optical transceiver receives an optical signal outputted from the second main optical transceiver using an infrared (IR) ray that passes through the first semiconductor substrate.

According to further embodiments, a memory card includes a memory, and a memory controller controlling an operation of the memory. The memory comprises a package substrate, a first semiconductor substrate and a second semiconductor substrate stacked on the package substrate, and an optical transceiver generating and receiving optical signals travelling between the package substrate and the second semiconductor substrate using infrared (IR) rays that pass through the first semiconductor substrate.

According to further embodiments, a memory card includes a memory, and a memory controller controlling an operation of the memory. The memory comprises a package substrate including a first main optical transceiver and a second main optical transceiver, a first semiconductor substrate mounted on the package substrate and having a first subsidiary optical transceiver aligned with the first main optical transceiver, and a second semiconductor substrate stacked on the first semiconductor substrate and having a second subsidiary optical transceiver aligned with the second main optical transceiver. The first and second semiconductor substrates are laterally offset to have a step structure such that the second subsidiary optical transceiver receives an optical signal outputted from the second main optical transceiver using an infrared (IR) ray that passes through the first semiconductor substrate.

According to further embodiments, a memory card includes a memory, and a memory controller controlling an operation of the memory. The memory comprises a package substrate including a first main optical transceiver and a second main optical transceiver, a first semiconductor substrate mounted on the package substrate, the first semiconductor substrate having a first subsidiary optical transceiver aligned with the first main optical transceiver, and a second semiconductor substrate stacked on the first semiconductor substrate, the second semiconductor substrate having a second subsidiary optical transceiver aligned with the second main optical transceiver. The second subsidiary optical transceiver receives an optical signal outputted from the second main optical transceiver using an infrared (IR) ray that passes through the first semiconductor substrate.

According to further embodiments, an electronic system includes a memory, and a controller coupled with the memory through a bus. The memory or the controller comprises a package substrate, a first semiconductor substrate and a second semiconductor substrate stacked on the package substrate, and an optical transceiver suitable generating and receiving optical signals travelling between the package substrate and the second semiconductor substrate using infrared (IR) rays that pass through the first semiconductor substrate.

According to further embodiments, an electronic system includes a memory, and a controller coupled with the memory through a bus. The memory or the controller comprises a package substrate including a first main optical transceiver and a second main optical transceiver, a first semiconductor substrate mounted on the package substrate, the first semiconductor substrate having a first subsidiary optical transceiver aligned with the first main optical transceiver, and a second semiconductor substrate stacked on the first semiconductor substrate, the second semiconductor substrate having a second subsidiary optical transceiver aligned with the second main optical transceiver. The first and second semiconductor substrates are laterally offset to have a step structure such that the second subsidiary optical transceiver receives an optical signal outputted from the second main optical transceiver using an infrared (IR) ray that passes through the first semiconductor substrate.

According to further embodiments, an electronic system includes a memory, and a controller coupled with the memory through a bus. The memory or the controller comprises a package substrate in which a first main optical transceiver and a second main optical transceiver are laterally disposed, a first semiconductor substrate mounted on the package substrate, the first semiconductor substrate having a first subsidiary optical transceiver aligned with the first main optical transceiver, and a second semiconductor substrate stacked on the first semiconductor substrate, the second semiconductor substrate having a second subsidiary optical transceiver aligned with the second main optical transceiver. The second subsidiary optical transceiver receives an optical signal outputted from the second main optical transceiver using an infrared (IR) ray that passes through the first semiconductor substrate.

BRIEF DESCRIPTION OF THE DRAWINGS

Embodiments will become more apparent in view of the attached drawings and accompanying detailed description, in which.

DETAILED DESCRIPTION

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of this disclosure.

It will also be understood that when an element is referred to as being "on," "above," "below," or "under" another element, it can be directly "on," "above," "below," or "under" the other element, respectively, or intervening elements may also be present. Accordingly, the terms such as "on," "above," "below," or "under" which are used herein are for the purpose of describing particular embodiments only and are not intended to be limiting.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion. Semiconductor chips may be obtained by separating a semiconductor substrate such as a wafer into a plurality of pieces using a die sawing process.

The semiconductor chips may correspond to memory chips or logic chips. The memory chips may include dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits which are integrated on and/or in the semiconductor substrate. The logic chip may include logic circuits which are integrated on and/or in the semiconductor substrate. In some cases, the term "semiconductor substrate" used herein may be construed as a semiconductor chip or a semiconductor die in which integrated circuits are formed.

Figure 1:
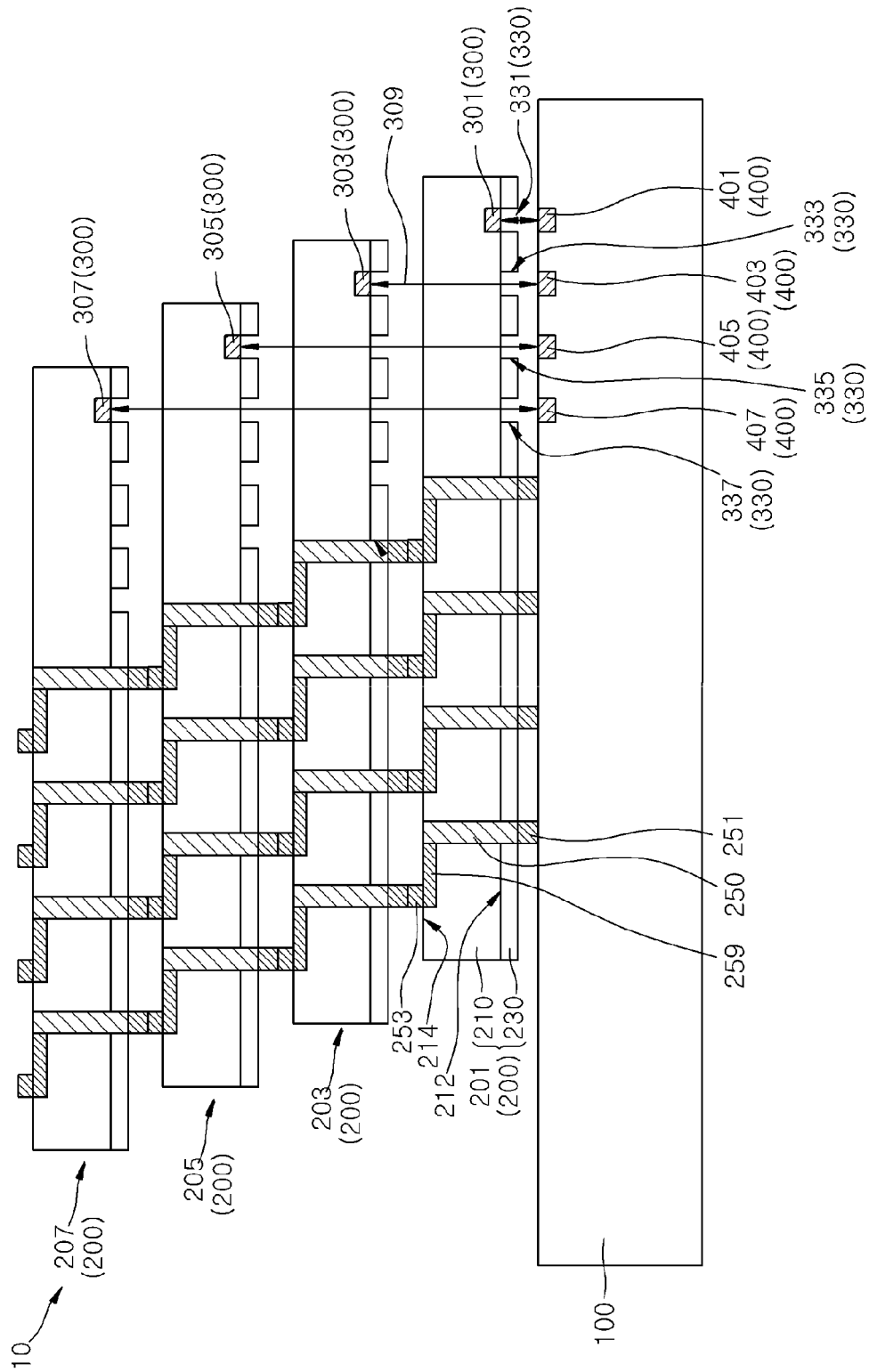
FIG. 1 is a cross sectional view and FIGS. 2 and 3 are schematic views illustrating a semiconductor package according to an embodiment.
Figure 2:
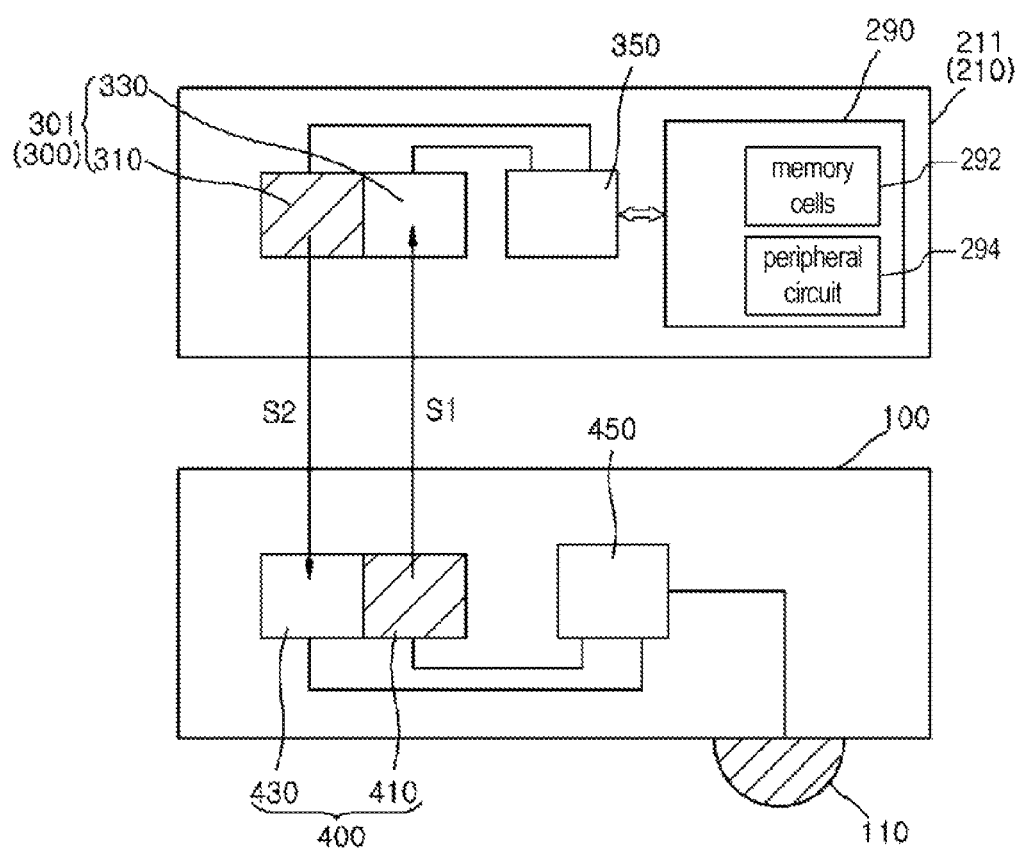
Figure 3:
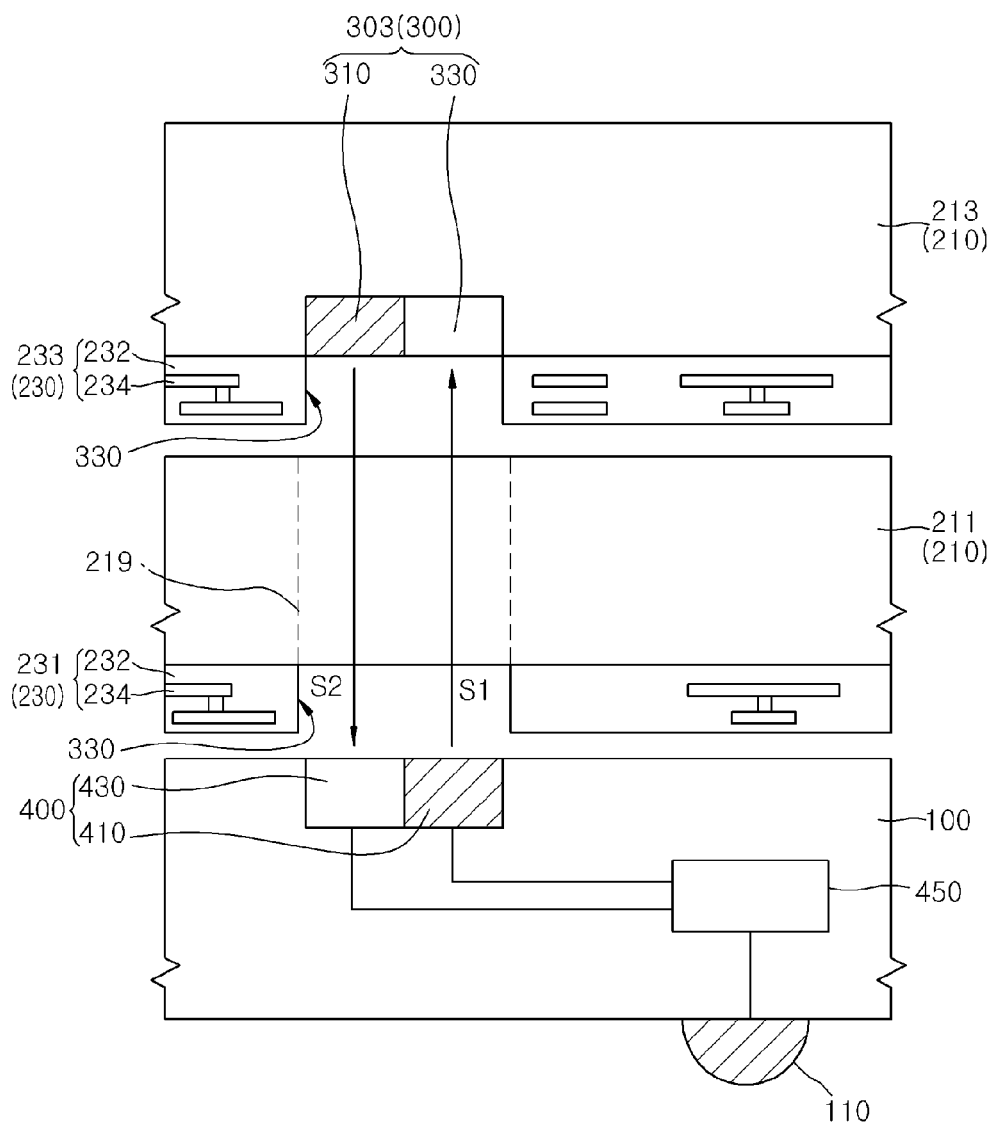

FIG. 1 is a cross-sectional view illustrating a semiconductor package according to an embodiment, and FIGS. 2 and 3 are schematic views illustrating optical transceivers included in the semiconductor package of FIG. 1.

Referring to FIG. 1, a semiconductor package 10 may include a package substrate 100 and a plurality of semiconductor chips 200 mounted on the package substrate 100. The package substrate 100 may correspond to a member that electrically connects the semiconductor chips 200 to an external module substrate (not shown) or an external electronic system. In some embodiments, the package substrate 100 may be a printed circuit board (PCB) or an embedded substrate that includes circuit interconnections therein. In some embodiments, the package substrate 100 may be a silicon substrate including a semiconductor chip or a silicon interposer. Although FIG. 1 illustrates an example in which the semiconductor chips 200 are mounted on an outer surface of the package substrate 100, embodiments are not limited thereto. For example, in some embodiments, the semiconductor chips 200 may be embedded in the package substrate 100.

The semiconductor chips 200 may be memory chips in which data are stored. In an embodiment in which the semiconductor chips 200 are vertically stacked on the package substrate 100, each of the semiconductor chips 200 may have the same function or the same configuration. Alternatively, at least one of the semiconductor chips 200 may have a different function from the others. For example, the semiconductor chips 200 may include a memory chip for storing data and a logic chip such as a controller chip for controlling the memory chip.

Each of the semiconductor chips 200 may include a semiconductor substrate 210 and an interconnection layer 230 disposed on the semiconductor substrate 210. The semiconductor substrate 210 may include an integrated circuit that performs a desired function, and the interconnection layer 230 may include interlayer insulation layers and internal interconnection lines disposed in the interlayer insulation layers. The semiconductor substrate 210 may be a silicon substrate, and circuit elements such as transistors may be disposed on a first surface 212 of the semiconductor substrate 210. These circuit elements may be electrically connected to each other by internal interconnection lines, and the internal interconnection lines may be insulated from each other by the interlayer insulation layers.

Infrared (IR) rays may be used in optical communication between the semiconductor chips 200 or between the semiconductor chips 200 and the package substrate 100, and optical transceivers 300 and 400 may be disposed in the semiconductor chips 200 and the package substrate 100 for the optical communication. For optical communication using IR rays, data that is stored, or data signals that are intended to be stored in the semiconductor chips 200 may be converted into optical signals and the optical signals may be transmitted through optical signal paths. In addition, control signals for controlling operations of the semiconductor chips 200 may also be converted into optical signals and the optical signals may be transmitted through optical signal paths. Each of the optical transceivers 300 and 400 may include a light receiving element for receiving IR rays and a light emitting element for generating IR rays.

The IR rays may have a wavelength of about 780 nanometers or greater. For example, the IR rays may have a wavelength of about 1200 nanometers to about 15000 nanometers. The IR rays may penetrate the semiconductor substrate 210 of each semiconductor chip 200 when optical signals are transmitted. Thus, IR rays having a relatively long wavelength may be used in the optical communication to reduce propagation loss in the semiconductor substrate 210. For example, IR rays having a wavelength of about 1310 nanometers, 1383 nanometers, 1550 nanometers, 1610 nanometers or 1625 nanometers may be used as a carrier of optical signals to reduce the propagation loss. The IR rays having such wavelength are widely used in optical communication field using a medium such as an optical fiber. Referring to FIGS. 1, 2 and 3, the optical transceivers 300 and 400 may include a main optical transceiver 400 disposed in the package substrate 100 and a subsidiary optical transceiver 300 disposed in the semiconductor substrate 210. The main optical transceiver 400 may include a main optical transmitter 410 and a main optical receiver 430. The main optical transmitter 410 may include a light emitting portion having a light emitting element such as a light emitting diode (LED) or a laser diode generating the IR rays, and the main optical receiver 430 may include a light receiving portion having a light receiving element such as a photo diode that converts the IR rays into an electrical signal. In some embodiments, the main optical transmitter 410 may include a plurality of light emitting portions that generate a plurality of distinct IR rays having different wavelengths and the main optical receiver 430 may include a plurality of light receiving portions that receive a plurality of distinct IR rays having different wavelengths. In some embodiments, each of the light receiving portions of the main optical receiver 430 may be covered with an optical filter (not shown) so that the receiver 430 only receives one or more predetermined wavelength of IR rays.

A controller 450 may be disposed in the package substrate 100 to control operations of the main optical transceiver 400. The controller 450 may process signals received by the main optical receiver 430 and transmit the processed results to an external device through a connection terminal 110. The connection terminal 110 may be a solder ball attached to the package substrate 100. Further, the controller 450 may transmit electrical signals inputted through the connection terminal 110 to the main optical transmitter 410. The controller 450 may process data signals for the optical communication and may control operations of the main optical transmitter 410 and the main optical receiver 430.

A subsidiary optical transceiver 300 paired with a main optical transceiver 400 may be disposed in the semiconductor substrate 210 of the semiconductor chip 200. As illustrated in FIG. 2, a first subsidiary optical transceiver 301 may be disposed in a first semiconductor substrate 211 facing the package substrate 100, and the first subsidiary optical transceiver 301 may be aligned with the main optical transceiver 400. The first subsidiary optical transceiver 301 may include a first subsidiary optical receiver 330 that is aligned with the main optical transmitter 410 to receive a first optical signal S1 (e.g., a first IR signal) outputted from the main optical transmitter 410. In addition, the first subsidiary optical transceiver 301 may include a first subsidiary optical transmitter 310 that is aligned with the main optical receiver 430 and transmits a second optical signal S2 (e.g., a second IR signal) to the main optical receiver 430.

The first subsidiary optical receiver 330 may be a light receiving portion having a light receiving element such as a photo diode that converts the first optical signal S1 into an electrical signal. The first subsidiary optical transmitter 310 may include a light emitting portion having a light emitting element such as a light emitting diode (LED) or a laser diode generating the second optical signal S2. In some embodiments, the first subsidiary optical transmitter 310 may include a plurality of light emitting portions that generate a plurality of distinct IR rays having different wavelengths, and the first subsidiary optical receiver 330 may include a plurality of light receiving portions that receive a plurality of distinct IR rays having different wavelengths. In some embodiments, each of the light receiving portions of the first subsidiary optical receiver 330 may include an optical filter (not shown) so that the receiver 330 only receives one or more predetermined wavelength of IR rays.

A controller 350 may be disposed in the first semiconductor substrate 211 and control operations of the first subsidiary optical transceiver 301. The controller 350 may process signals received by the first subsidiary optical receiver 330 and transmit the processed results to an integrated circuit portion 290 of the first semiconductor substrate 211. The integrated circuit portion 290 may include memory cells 292 and a peripheral circuit portion 294 driving the memory cells 292. Further, the controller 350 may transmit electrical signals outputted from the integrated circuit portion 290 to the first subsidiary optical transmitter 310 and may control the operation of the first subsidiary optical transmitter 310 such that the first subsidiary optical transmitter 310 generates the second optical signal S2 and transmits the second optical signal S2 to the main optical receiver 430. The controller 350 may process data signals for optical communication and may control the operations of the first subsidiary optical transmitter 310 and the first subsidiary optical receiver 330.

The first optical signal S1 inputted to the first subsidiary optical receiver 330 may include commands for driving the integrated circuit portion 290 or data to be stored in the integrated circuit portion 290. When a plurality of semiconductor chips 200 are stacked on the package substrate 100 as illustrated in FIG. 1, the first optical signal S1 may include a chip selection signal for selecting an integrated circuit portion 290 disposed in any one of the plurality of semiconductor chips 200. The second optical signal S2 outputted from the first subsidiary optical transmitter 310 may include data which are read out from the integrated circuit portion 290 disposed in the first semiconductor substrate 211.

Referring again to FIG. 1, the semiconductor chips 200 may be stacked on the package substrate 100 and each of the semiconductor chips 200 may include the subsidiary optical transceiver 300 that communicates with the main optical transceiver 400 through optical signals. Each of the semiconductor chips 200 may include a semiconductor substrate 210. When the semiconductor chips 200 including first to fourth semiconductor chips 201, 203, 205 and 207 are stacked on the package substrate 100 to realize the semiconductor package 10, the first to fourth semiconductor chips 201, 203, 205 and 207 may have the same function or the same configuration and the main optical transceiver 400 may include first to fourth main optical transceivers 401, 403, 405 and 407. In such an embodiment, the first subsidiary optical transceiver 301 included in the first semiconductor chip 201 may be disposed to be aligned with the first main optical transceiver 401 disposed in the package substrate 100, and the second subsidiary optical transceiver 303 included in the second semiconductor chip 203 may be aligned with the second main optical transceiver 403 disposed in the package substrate 100. Similarly, the third subsidiary optical transceiver 305 included in the third semiconductor chip 205 may be aligned with the third main optical transceiver 405 disposed in the package substrate 100, and the fourth subsidiary optical transceiver 307 included in the fourth semiconductor chip 207 may be aligned with the fourth main optical transceiver 407 disposed in the package substrate 100.

When the first to fourth semiconductor chips 201, 203, 205 and 207 have the same function or the same configuration, the positions where the first to fourth subsidiary optical transceivers 301, 303, 305 and 307 are disposed in respective ones of the first to fourth semiconductor chips 201, 203, 205 and 207 may be substantially the same. Thus, in order to vertically align the first to fourth subsidiary optical transceivers 301, 303, 305 and 307 with respective ones of the first to fourth main optical transceivers 401, 403, 405 and 407 disposed in the package substrate 100, the first to fourth semiconductor chips 201, 203, 205 and 207 may be laterally offset to have a step structure. That is, an upper semiconductor chip may be stacked on a lower semiconductor chip immediately disposed under the upper semiconductor chip such that one edge of the lower semiconductor chip is exposed. As seen in FIG. 1, edges of the first to fourth semiconductor chips may be laterally offset from one another so that the stack of chips 200 is in the form of steps, and a plurality of optical paths are created between package substrate 100 and the chips. Thus, the first to fourth subsidiary optical transceivers 301, 303, 305 and 307 may be stacked to optically communicate with respective ones of the first to fourth main optical transceivers 401, 403, 405 and 407 in parallel with one another.

Referring again to FIGS. 1 and 3, when the second semiconductor substrate 213 of the second semiconductor chip 203 is stacked on the first semiconductor substrate 211 of the first semiconductor chip 201 located on the package substrate 100, the second subsidiary optical transceiver 303 disposed in the second semiconductor substrate 213 may optically communicate with the main optical transceiver 400 (in FIG. 1, the second main optical transceiver 403) through the optical signals S1 and S2 passing through the first semiconductor substrate 211. In such an embodiment, the second subsidiary optical transceiver 303 may include a subsidiary optical transmitter 310 and a subsidiary optical receiver 330, such as the first subsidiary optical transceiver 301 described with reference to FIG. 2. Thus, the second subsidiary optical transceiver 303 may transmit optical signals to the main optical transceiver 400 or may receive optical signals outputted from the main optical transceiver 400. The IR rays with the optical signals may follow an optical path 219 of the first semiconductor substrate 211 to transmit the optical signals.

As described above, an interconnection layer 230 may be disposed on the first surface (212 of FIG. 1) of each semiconductor substrate 210, and the interconnection layer 230 may include an internal interconnection structure 234 including internal interconnection lines and an interlayer insulation structure 232 that insulates the internal interconnection lines from each other. Metal patterns constituting the internal interconnection structure 234 may block IR rays. Thus, the internal interconnection structure 234 may be designed in order to accommodate the optical path 219. In some embodiments, the interconnection layer 230 of each semiconductor chip 200 may be patterned to form a window 330 exposing the subsidiary optical transceiver 300 of each semiconductor chip 200. This is for preventing transmission of the optical signals S1 and S2 from being disturbed. For example, a window 330 may be disposed in a second interconnection layer 233 on the second semiconductor substrate 213 to expose the second subsidiary optical transceiver 303, and a window 330 that is aligned with the second subsidiary optical transceiver 303 may be disposed in a first interconnection layer 231 on the first semiconductor substrate 211. That is, as illustrated in FIG. 1, a plurality of windows 330 may be disposed in portions of the interconnection layers 230 which overlap with optical transceivers 300 and 400. In particular, first to fourth windows 331, 333, 335 and 337 may penetrate portions of the interconnection layer 230 of the first semiconductor chip 201 to vertically overlap with the first to fourth subsidiary optical transceivers 301, 303, 305 and 307, respectively. In some embodiments, the interconnection layer may not have a window. In some embodiments, the internal interconnection structure including metal patterns may be formed to be not overlap with optical transceivers.

Referring again to FIG. 1, one type of signal transmission between the semiconductor chips 200 or between each semiconductor chip 200 and the package substrate 100 is based on optical signals. The semiconductor package 10 may also include an electrical signal transmission system that uses an interconnection structure for signal transmission between the semiconductor chips 200 or between each semiconductor chip 200 and the package substrate 100.

Through electrodes 250 may penetrate each semiconductor substrate 210 of the semiconductor chips 200, and the through electrodes 250 may be combined with each other by first and second connection layers 251 and 253 to realize a connection structure of the through electrodes 250. In such an embodiment, because the second semiconductor chip 203 may be stacked on and laterally offset with the first semiconductor chip 201, the through electrode 250 of the second semiconductor chip 203 may not be vertically aligned with the through electrode 250 of the first semiconductor chip 201. Thus, electrode extensions 259 may be disposed on a second surface 214 (corresponding to a backside surface) of the first semiconductor substrate 210 to electrically connect the through electrode 250 of the second semiconductor chip 203 to the through electrode 250 of the first semiconductor chip 201. Similarly, electrode extensions 259 may be disposed on backside surfaces of the second, third and fourth semiconductor substrates 210.

In an embodiment, the electrode extensions 259 may be interconnection lines which connect through electrode 250 in a chip 200 to structures outside the chip. That is, first ends of the electrode extensions 259 on the second surface 214 of the first semiconductor substrate 210 may be connected to the through electrode 250 of the first semiconductor chip 201, and second ends of the electrode extensions 259 on the second surface 214 of the first semiconductor substrate 210 may be connected to the through electrode 250 of the second semiconductor chip 203. The first connections 251, which may be connection bumps such as solder bumps or copper pillar bumps, may be disposed on lower ends of the through electrodes 250 of the second semiconductor chip 203, and the second connections 253 such may be disposed on the second ends of the electrode extensions 259 on the second surface 214 of the first semiconductor substrate 210. The first connections 251 may be attached to the second connections 253 such that the through electrodes 250 of the first semiconductor chip 201 are electrically connected to the through electrodes 250 of the second semiconductor chip 203. The electrode extensions 259 may be disposed on the second surfaces 214 of the semiconductor substrates 210 opposite to the first surfaces 212 adjacent to the subsidiary optical transceivers 300.

An electrical connection structure including the through electrodes 250 may provide electrical signal paths between the semiconductor chips 200 and the package substrate 100, power supply paths for applying electric power to the semiconductor chips 200, or ground paths for applying a ground voltage to the semiconductor chips 200.

Figure 4:
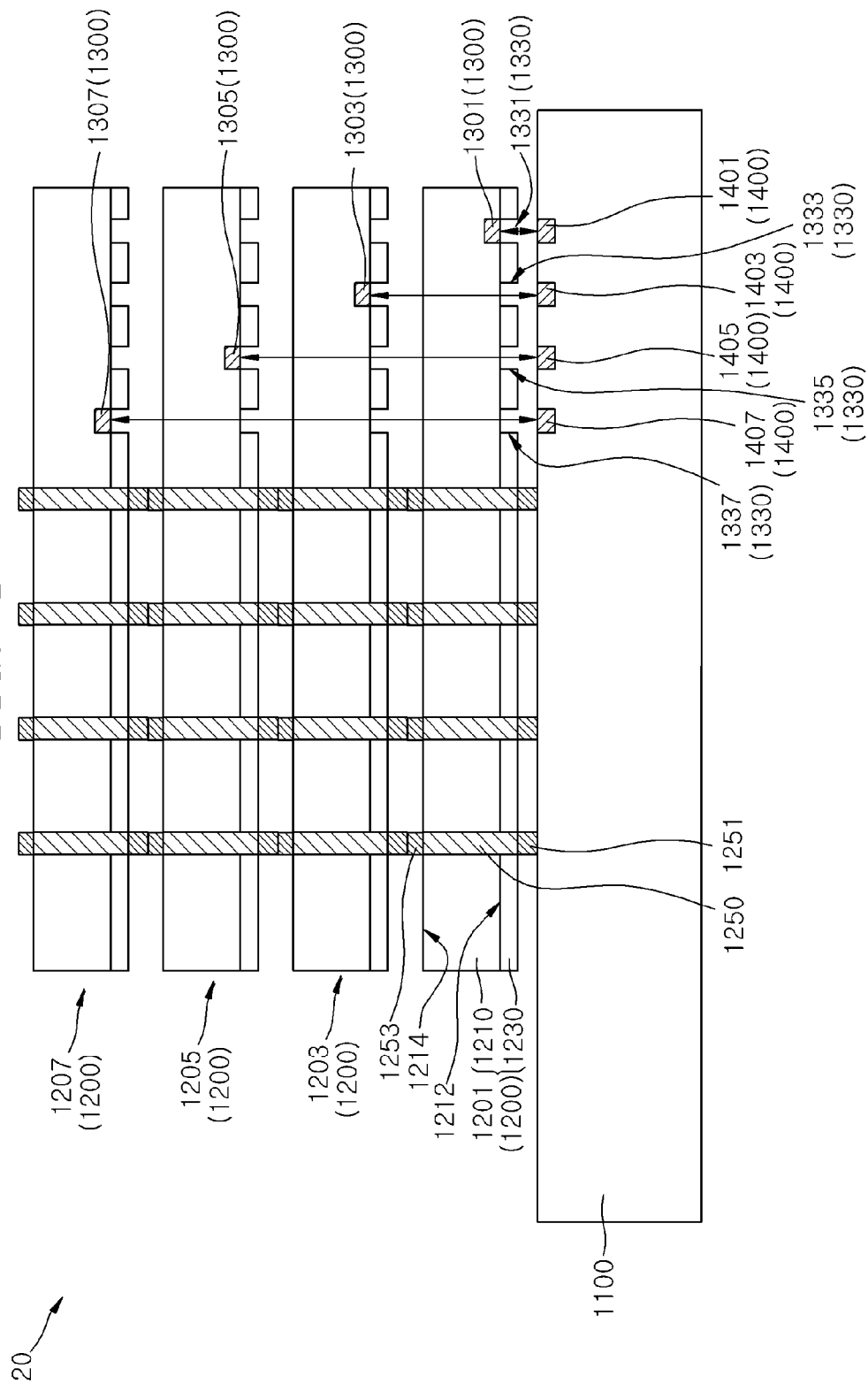
FIG. 4 is a cross-sectional view illustrating a semiconductor package according to another embodiment.

Referring to FIG. 4, a semiconductor package 20 may include a package substrate 1100 and semiconductor chips 1200 vertically stacked on the package substrate 1100. First to fourth main optical transceivers 1401, 1403, 1405 and 1407 may be disposed in the package substrate 1100, and subsidiary optical transceivers 1300 may be disposed in the semiconductor chips 1200. Thus, the semiconductor chips 1200 and the package substrate 1100 may communicate with each other using optical signals. In such an embodiment, if the first to fourth semiconductor chips 1201, 1203, 1205 and 1207 have the same dimension, the positions where the first to fourth subsidiary optical transceivers 1301, 1303, 1305 and 1307 are disposed in respective ones of the first to fourth semiconductor chips 1201, 1203, 1205 and 1207 may be different. Thus, when a stack of first to fourth semiconductor chips 1201, 1203, 1205 and 1207 are vertically aligned with each other, the first to fourth subsidiary optical transceivers 1301, 1303, 1305 and 1307 may be offset so they do not vertically overlap with each other, as illustrated in FIG. 4. Accordingly, even when edges of the first to fourth semiconductor chips 1201, 1203, 1205 and 1207 are vertically aligned with each other, the first to fourth semiconductor chips 1201, 1203, 1205 and 1207 may optically communicate with the first to fourth main optical transceivers 1401, 1403, 1405 and 1407 of the package substrate 1100, respectively.

When engaging in optical communication using IR rays, data that is stored, or data signals that are intended to be stored in the semiconductor chips 1200 may be converted into optical signals and the optical signals may be transmitted through optical signal paths. In addition, control signals for controlling operations of the semiconductor chips 1200 or for selecting any one of the semiconductor chips 1200 may also be converted into optical signals and the optical signals may be transmitted through the optical signal paths. Each of the optical transceivers 1300 and 1400 may include a light receiving element for receiving IR rays and a light emitting element for generating IR rays. The IR rays may have a wavelength of about 1200 nanometers to about 15000 nanometers.

The IR rays may pass through the semiconductor substrates 1210 of the semiconductor chips 1200 to transmit the optical signals. Thus, IR rays having a relatively long wavelength may be used in the optical communication to reduce optical signal attenuation from the semiconductor substrate 1210. For example, IR rays having a wavelength of about 1310 nanometers, 1383 nanometers, 1550 nanometers, 1610 nanometers or 1625 nanometers may be used as a carrier of the signals to reduce propagation loss. The IR rays having such wavelength are widely used in optical communication field using a medium such as an optical fiber.

Each of the optical transceivers 1300 and 1400 may include a light emitting portion and a light receiving portion. Each of the optical transceivers 1300 and 1400 may further include a controller that controls operations of the light emitting portion and the light receiving portion and executes data processing operations. The light emitting portion may include a light emitting diode (LED) or a laser diode generating the IR rays, and the light receiving portion may include a photo diode that converts the IR rays into an electrical signal. In some embodiments, the light emitting portion may include a plurality of light emitting elements that generate a plurality of distinct IR rays having different wavelengths and the light receiving portion may include a plurality of light receiving elements that receive a plurality of distinct IR rays having different wavelengths. In some embodiments, each of the light receiving elements may include an optical filter (not shown) configured to remove undesired wavelengths.

The semiconductor chips 1200 and the package substrate 1100 may be electrically connected to each other by through electrodes 1250, and these through electrodes 1250 may be used as signal transmission paths, power transmission paths, or ground paths.

In the present embodiment, the through electrodes 1250 of an upper semiconductor chip 1200 is vertically aligned with and electrically connected to the through electrodes 1250 of a lower semiconductor chip 1200.

An interconnection layer 1230 may be disposed on a first surface 1212 of each semiconductor substrate 1210. First connections 1251 such as connection bumps may be disposed on lower ends of the through electrodes 1250 adjacent to the first surfaces 1212, and second connections 1253 such as connection bumps may be disposed on upper ends of the through electrodes 1250 adjacent to second surfaces 1214. Windows 1330, for example, first to fourth windows 1331, 1333, 1335 and 1337 may be disposed in the interconnection layers 1230 to expose the first to fourth subsidiary optical transceivers 1301, 1303, 1305 and 1307. In some embodiments, the interconnection layer may not have a window. In some embodiments, the internal interconnection structure including metal patterns may be formed to not overlap with optical transceivers.

Figure 5:
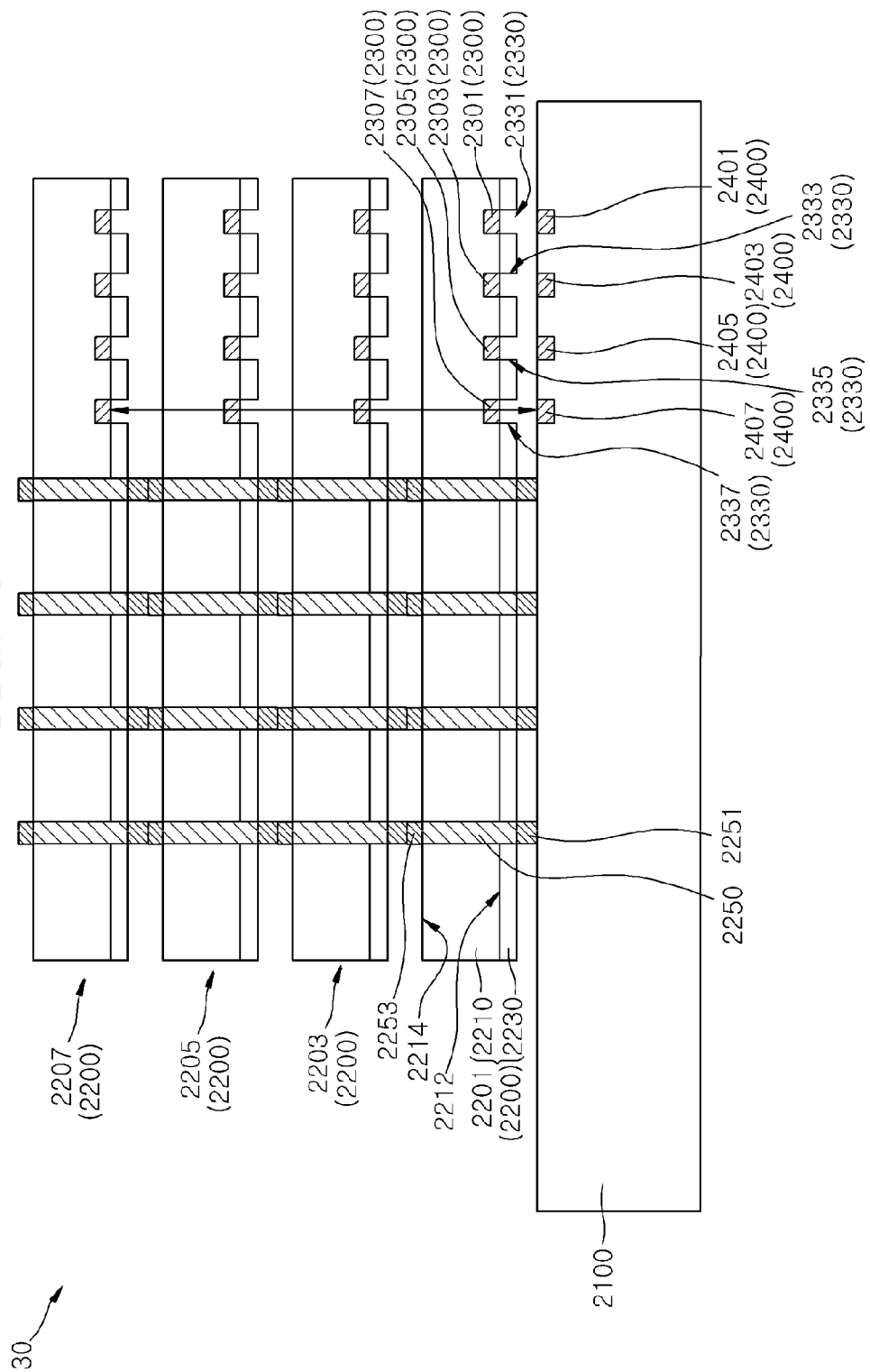
FIG. 5 is a cross-sectional view illustrating a semiconductor package according to still another embodiment.

Referring to FIG. 5, a semiconductor package 30 may include a package substrate 2100 and semiconductor chips 2200 vertically stacked on the package substrate 2100. Main optical transceivers 2400, for example, first to fourth main optical transceivers 2401, 2403, 2405 and 2407 may be disposed in the package substrate 2100. Further, subsidiary optical transceivers 2300, for example, first to fourth subsidiary optical transceivers 2301, 2303, 2305 and 2307 may be disposed in each of first to fourth semiconductor chips 2201, 2203, 2205 and 2207. Thus, the semiconductor chips 2200 and the package substrate 2100 may communicate with each other using optical signals. In the present embodiment, the semiconductor package has four semiconductor chips and each of the semiconductor chips has four subsidiary optical transceivers, but it is not intended to be limiting. The semiconductor package may have two, three, five or more than five semiconductor chips. The semiconductor chips may have two, three, five or more than five subsidiary optical transceivers and the package substrate may have two, three, five or more than five main optical transceivers.

In the present embodiment, the second semiconductor chip 2203 are stacked on the first semiconductor chip 2201 such that the first to fourth subsidiary optical transceivers 2301, 2303, 2305 and 2307 in the second semiconductor chip 2203 are vertically aligned with the first to fourth subsidiary optical transceivers 2301, 2303, 2305 and 2307, respectively, in the first semiconductor chip 2201, and the third semiconductor chip 2205 is stacked on the second semiconductor chip 2203 such that the first to fourth subsidiary optical transceivers 2301, 2303, 2305 and 2307 in the third semiconductor chip 2205 are vertically aligned with the first to fourth subsidiary optical transceivers 2301, 2303, 2305 and 2307, respectively, in the second semiconductor chip 2203. Similarly, the fourth semiconductor chip 2207 may be stacked on the third semiconductor chip 2205 such that the first to fourth subsidiary optical transceivers 2301, 2303, 2305 and 2307 in the fourth semiconductor chip 2207 are vertically aligned with the first to fourth subsidiary optical transceivers 2301, 2303, 2305 and 2307 in the third semiconductor chip 2205. Thus, each of the subsidiary optical transceivers 2301, 2303, 2305 and 2307 in a semiconductor chip is vertically overlap with each of the subsidiary optical transceivers 2301, 2303, 2305 and 2307 in the other semiconductor chip.

When engaging in optical communication using IR rays, data that is stored, or data signals that are intended to be stored in the semiconductor chips 2200 may be converted into optical signals and the optical signals may be transmitted through optical signal paths. In addition, control signals for controlling operations of the semiconductor chips 2200 or for selecting any one of the semiconductor chips 2200 may also be converted into optical signals and the optical signals may be transmitted through the optical signal paths. Each of the optical transceivers 2300 and 2400 may include a light receiving element for receiving IR rays and a light emitting element for generating IR rays. The IR rays may have a wavelength of about 1200 nanometers to about 15000 nanometers. The IR rays may pass through the semiconductor substrates 2210 constituting the semiconductor chips 2200 to transmit the optical signals. Thus, IR rays having a relatively long wavelength may be used in optical communication to reduce propagation loss from the semiconductor substrate 2210. For example, the IR rays having a wavelength of about 1310 nanometers, 1383 nanometers, 1550 nanometers, 1610 nanometers or 1625 nanometers may be used as a carrier of optical signals to reduce the propagation loss. The IR rays having such wavelength are widely used in optical communication field using a medium such as an optical fiber.

Each of the optical transceivers 2300 and 2400 may include a light emitting portion and a light receiving portion. Each of the optical transceivers 2300 and 2400 may further include a controller that controls operations of the light emitting portion and the light receiving portion and executes data processing operations. The light emitting portion may include a light emitting diode (LED) or a laser diode generating IR rays, and the light receiving portion may include a photo diode that converts the IR rays into an electrical signal. In some embodiments, the light emitting portion may include a plurality of light emitting elements that generate a plurality of distinct IR rays having different wavelengths and the light receiving portion may include a plurality of light receiving elements that receive a plurality of distinct IR rays having different wavelengths. In some embodiments, each of the light receiving elements may include an optical filter (not shown) to remove undesired wavelengths of light. Each of the subsidiary optical transceivers 2300 may have diodes (e.g., LEDs, laser diodes or photo diodes) with transparent electrodes such that IR rays pass through the subsidiary optical transceivers 2300.

The semiconductor chips 2200 and the package substrate 2100 may be electrically connected to each other by through electrodes 2250, and these through electrodes 2250 may be used as signal transmission paths, power transmission paths, or ground paths. In the present embodiment, the through electrodes 2250 of the upper semiconductor chip 2200 are vertically aligned with and electrically connected to the through electrodes 2250 of the lower semiconductor chip 2200.

An interconnection layer 2230 may be disposed on a first surface 2212 of each semiconductor substrate 2210. First connection layers 2251 may be disposed on lower ends of the through electrodes 2250 adjacent to the first surfaces 2212, and second connection layers 2253 may be disposed on upper ends of the through electrodes 2250 adjacent to second surfaces 2214 of the semiconductor substrates 2210 opposite to the first surfaces 2212. Windows 2330, for example, first to fourth windows 2331, 2333, 2335 and 2337 may be disposed in the interconnection layers 2230 to expose the first to fourth subsidiary optical transceivers 2301, 2303, 2305 and 2307. In some embodiments, the interconnection layer may not have a window. In some embodiments, the internal interconnection structure including metal patterns may be formed to be not overlap with optical transceivers.

Figure 6:
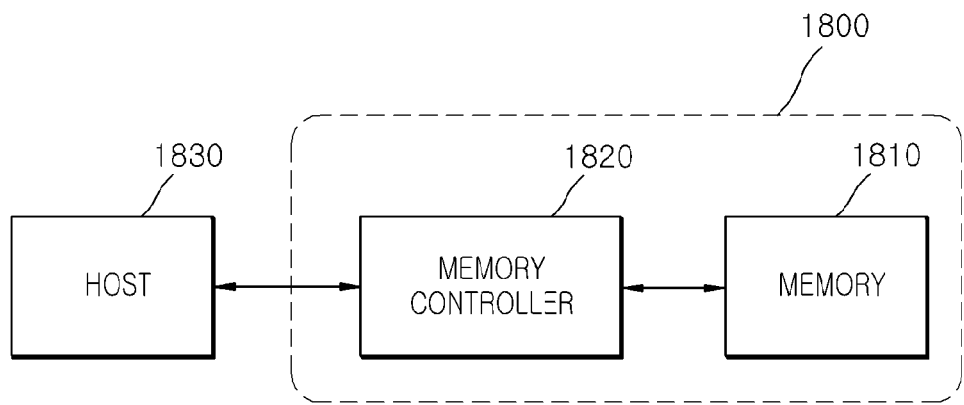
FIG. 6 is a block diagram illustrating an electronic system including a semiconductor package according to some embodiments.

Referring to FIG. 6, a semiconductor package in accordance with an embodiment may be provided in the form of a memory card 1800. For example, the memory card 1800 may include a memory 1810 such as a nonvolatile memory device and a memory controller 1820. The memory 1810 and the memory controller 1820 may store data or read out stored data.

The memory 1810 may include a nonvolatile memory device according to an embodiment. The memory controller 1820 may control the memory 1810 such that stored data is read out or data is stored in response to a read/write request from a host 1830.

Figure 7:
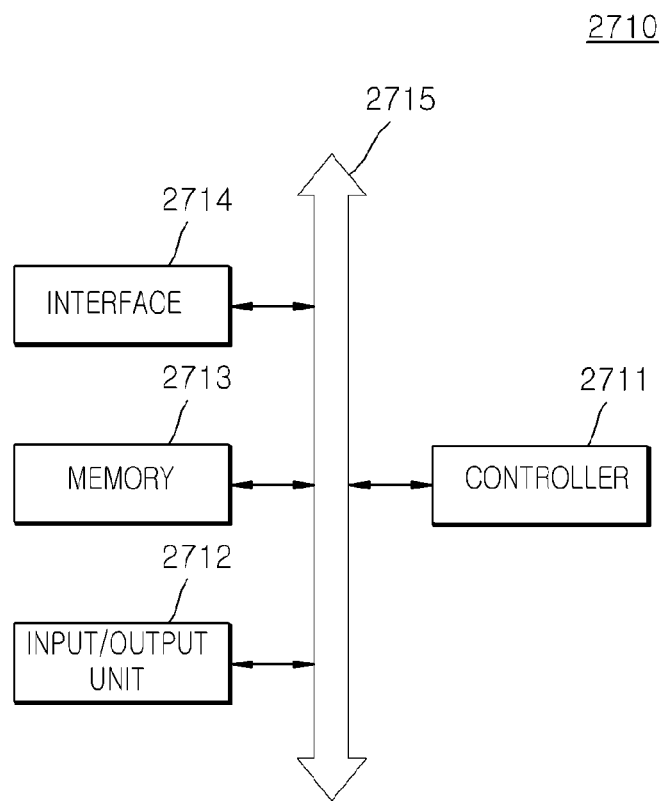
FIG. 7 is a block diagram illustrating another electronic system including a semiconductor package according to some embodiments.

Referring to FIG. 7, a semiconductor package in accordance with ab embodiment may be applied to an electronic system 2710. The electronic system 2710 may include a controller 2711, an input/output unit 2712, and a memory 2713. The controller 2711, the input/output unit 2712 and the memory 2713 may be coupled with one another through a bus 2715 providing a path through which data moves. The memory 2713 and the controller 2711 may constitute a semiconductor package in accordance with an embodiment.

For example, the controller 2711 may include at least one microprocessor, at least one digital signal processor, at least one microcontroller, and logic devices capable of performing the same functions as these components. The controller 2711 or the memory 2713 may include a semiconductor package according to an embodiment. The input/output unit 2712 may include a keypad, a keyboard, a display device, a touch screen and so forth. The memory 2713 is a device for storing data. The memory 2713 may store data and/or commands to be executed by the controller 2711, and the like.

The memory 2713 may include a volatile memory device such as a DRAM and/or a nonvolatile memory device such as a flash memory. For example, a flash memory may be mounted to an information processing system such as a mobile terminal or a desk top computer. The flash memory may constitute a solid state drive (SSD). In this case, the electronic system 2710 may stably store a large amount of data in a flash memory system.

The electronic system 2710 may further include an interface 2714 configured to transmit and receive data to and from a communication network. The interface 2714 may be a wired or wireless type. For example, the interface 2714 may include an antenna or a wired or wireless transceiver.

The electronic system 2710 may be a mobile system, a personal computer, an industrial computer or a logic system performing various functions. For example, the mobile system may be a personal digital assistant (PDA), a portable computer, a tablet computer, a mobile phone, a smart phone, a wireless phone, a laptop computer, a memory card, a digital music system, or an information transmission/reception system.

In an embodiment in which the electronic system 2710 is equipment capable of performing wireless communication, the electronic system 2710 may be used in a communication system such as one of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Embodiments have been disclosed above for illustrative purposes. Those skilled in the art will appreciate that various modifications, additions and substitutions are possible, without departing from the scope and spirit of the accompanying claims.

What is claimed is:

1. A semiconductor package comprising:
   a package substrate including a first main optical transceiver and a second main optical transceiver;
   a first semiconductor substrate mounted on the package substrate, the first semiconductor substrate having a first subsidiary optical transceiver aligned with the first main optical transceiver;
   an interconnection layer disposed on a surface of the first semiconductor substrate, the interconnection layer having an internal interconnection structure and an interlayer insulation structure; and
   a second semiconductor substrate stacked on the first semiconductor substrate, the second semiconductor substrate having a second subsidiary optical transceiver aligned with the second main optical transceiver,
   wherein the first and second semiconductor substrates are laterally offset to have a step structure such that the second subsidiary optical transceiver receives an optical signal outputted from the second main optical transceiver using an infrared (IR) ray that propagates through the first semiconductor substrate,
   wherein the first semiconductor substrate includes a silicon substrate and an integrated circuit portion disposed on the silicon substrate,
   wherein the interconnection layer includes first and second windows vertically overlapping with the first and second subsidiary optical transceivers, respectively, and
   wherein the first and second windows open respective portions of the first semiconductor substrate.

2. The semiconductor package of claim 1, further comprising:
   a first through electrode penetrating the first semiconductor substrate;
   a second through electrode penetrating the second semiconductor substrate; and
   an electrode extension disposed on a first surface of the first semiconductor substrate opposite to the package substrate which electrically connects the first through electrode to the second through electrode.

3. The semiconductor package of claim 2, wherein the first through electrode, the electrode extension and the second through electrode provide an electrical signal path, a power supply path, or a ground path between the first and second semiconductor substrates and the package substrate.

4. The semiconductor package of claim 2, wherein the first subsidiary optical transceiver is disposed adjacent to a second surface of the first semiconductor substrate opposite to the first surface.

5. A semiconductor package comprising:
   a package substrate including a first main optical transceiver and a second main optical transceiver;
   a first semiconductor substrate mounted over the package substrate, the first semiconductor substrate having a first subsidiary optical transceiver aligned with the first main optical transceiver;
   an interconnection layer disposed on a surface of the first semiconductor substrate, the interconnection layer having an internal interconnection structure and an interlayer insulation structure; and
   a second semiconductor substrate stacked on the first semiconductor substrate, the second semiconductor substrate having a second subsidiary optical transceiver aligned with the second main optical transceiver,
   wherein the second subsidiary optical transceiver receives an optical signal outputted from the second main optical transceiver using an infrared (IR) ray that propagates through the first semiconductor substrate,
   wherein the first semiconductor substrate includes a silicon substrate and an integrated circuit portion disposed on the silicon substrate,
   wherein the interconnection layer has windows vertically overlapping with the first and second subsidiary optical transceivers, and
   wherein the windows open respective portions of the first semiconductor substrate.

6. The semiconductor package of claim 5, wherein the second semiconductor substrate is stacked on the first semiconductor substrate such that the second subsidiary optical transceiver does not vertically overlap with the first subsidiary optical transceiver.

7. The semiconductor package of claim 5, further comprising:
   a first through electrode penetrating the first semiconductor substrate;
   a second through electrode penetrating the second semiconductor substrate; and
   wherein the second through electrode is vertically aligned with and electrically coupled to the first through electrode.

8. The semiconductor package of claim 7, wherein the first through electrode and the second through electrode provide an electrical signal path, a power supply path, or a ground path between the first and second semiconductor substrates and the package substrate.

9. The semiconductor package of claim 5, wherein the second subsidiary optical transceiver provides a data signal path between the second semiconductor substrate and the package substrate.

* * * * *